(12) United States Patent
Bang et al.

(10) Patent No.: US 9,635,768 B2
(45) Date of Patent: *Apr. 25, 2017

(54) CIRCUIT BOARDS, CONNECTORS, CASES, CIRCUIT BOARD ASSEMBLIES, CASE ASSEMBLIES, DEVICES AND METHODS OF MANUFACTURING THE SAME

(71) Applicant: Samsung Electronics Co., Ltd., Suwon-si, Gyeonggi-do (KR)

(72) Inventors: Hyojae Bang, Hwasung-si (KR); Dogeun Kim, Seoul (KR); Hongkyun Kim, Sungnam-si (KR); Youngbok Jeon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/721,942

(22) Filed: May 26, 2015

(65) Prior Publication Data

US 2015/0253820 A1    Sep. 10, 2015

Related U.S. Application Data

(63) Continuation of application No. 14/622,328, filed on Feb. 13, 2015, which is a continuation of application
(Continued)

(30) Foreign Application Priority Data

Sep. 9, 2008    (KR) ........................ 10-2008-0088919

(51) Int. Cl.
*H05K 5/00* (2006.01)
*G06K 7/00* (2006.01)
(Continued)

(52) U.S. Cl.
CPC ............. *H05K 5/0026* (2013.01); *G06F 1/18* (2013.01); *G06F 1/185* (2013.01); *G06K 7/0047* (2013.01);
(Continued)

(58) Field of Classification Search
USPC ........ 439/76.1, 945, 946; 361/737; 235/492, 235/441
See application file for complete search history.

(56) References Cited

U.S. PATENT DOCUMENTS 3,876,884 A    4/1975   Housman et al.
4,488,201 A    12/1984  Webb et al.
(Continued)

FOREIGN PATENT DOCUMENTS

CN    2687870 Y      3/2005
CN    101149448 A    3/2008
(Continued)

OTHER PUBLICATIONS

Derwint ACC—No. 2009-054018, published 2011, month unknown.
(Continued)

*Primary Examiner* — Neil Abrams
(74) *Attorney, Agent, or Firm* — Harness, Dickey & Pierce, P.L.C.

(57) ABSTRACT

Example embodiments are directed to circuit boards, connectors, cases, circuit board assemblies, case assemblies, devices arid methods of manufacturing the same, which are common to at least two different form factors. In an example embodiment, the SSD includes a circuit board that is smaller than a case, and the circuit board is secured to the bottom surface of the case by the securing element. The securing element is spaced apart from edges of the case to allow using a circuit board that is smaller than the case.

25 Claims, 17 Drawing Sheets

Related U.S. Application Data

No. 13/678,115, filed on Nov. 15, 2012, now Pat. No. 8,982,567, which is a continuation of application No. 12/349,678, filed on Jan. 7, 2009, now abandoned.

(51) Int. Cl.

| | | |
|---|---|---|
| H01R 12/57 | (2011.01) | |
| H01R 12/50 | (2011.01) | |
| H05K 1/11 | (2006.01) | |
| H01R 13/00 | (2006.01) | |
| H05K 3/10 | (2006.01) | |
| H05K 3/30 | (2006.01) | |
| H05K 7/02 | (2006.01) | |
| H05K 13/00 | (2006.01) | |
| G06F 1/18 | (2006.01) | |
| H05K 1/18 | (2006.01) | |
| H01R 27/00 | (2006.01) | |
| H05K 1/02 | (2006.01) | |
| H05K 3/34 | (2006.01) | |

(52) U.S. Cl.
CPC ............ *H01R 12/57* (2013.01); *H01R 13/00* (2013.01); *H01R 23/70* (2013.01); *H05K 1/11* (2013.01); *H05K 1/117* (2013.01); *H05K 1/181* (2013.01); *H05K 3/10* (2013.01); *H05K 3/303* (2013.01); *H05K 7/02* (2013.01); *H05K 13/00* (2013.01); *H01R 27/00* (2013.01); *H05K 1/0295* (2013.01); *H05K 3/3405* (2013.01); *H05K 2201/09409* (2013.01); *H05K 2201/09709* (2013.01); *H05K 2201/09954* (2013.01); *H05K 2201/10159* (2013.01); *H05K 2201/10189* (2013.01); *H05K 2201/10446* (2013.01); *Y10S 439/946* (2013.01); *Y10S 439/951* (2013.01); *Y10T 29/49124* (2015.01); *Y10T 29/49147* (2015.01)

(56) References Cited

U.S. PATENT DOCUMENTS

| | | | |
|---|---|---|---|
| 4,647,123 A | 3/1987 | Chin et al. | |
| 4,798,946 A | 1/1989 | Fujii et al. | |
| 4,840,570 A * | 6/1989 | Mann, Jr. ........... | H01R 12/7005 361/787 |
| 4,872,091 A * | 10/1989 | Maniwa ................ | B41J 5/48 174/51 |
| 4,885,482 A | 12/1989 | Sharp et al. | |
| 4,890,832 A | 1/1990 | Komaki | |
| 4,903,402 A | 2/1990 | Norton et al. | |
| 4,908,738 A | 3/1990 | Kobari et al. | |
| 4,974,121 A | 11/1990 | Masuko et al. | |
| 5,010,446 A | 4/1991 | Scannell | |
| 5,031,076 A | 7/1991 | Kiku | |
| 5,038,250 A | 8/1991 | Uenaka et al. | |
| 5,061,845 A * | 10/1991 | Pinnavaia ............ | H05K 5/0269 235/487 |
| 5,144,533 A | 9/1992 | Annett | |
| 5,161,169 A * | 11/1992 | Galano ................ | G06F 1/18 361/679.31 |
| 5,163,833 A | 11/1992 | Olsen et al. | |
| 5,181,679 A | 1/1993 | Frielinghaus et al. | |
| 5,233,502 A | 8/1993 | Beatty et al. | |
| 5,270,984 A | 12/1993 | Bechtolsheim et al. | |
| 5,313,364 A | 5/1994 | Omori et al. | |
| 5,375,040 A * | 12/1994 | Cooper ................ | H05K 7/142 361/730 |
| 5,409,385 A | 4/1995 | Tan et al. | |
| 5,440,755 A | 8/1995 | Harwer et al. | |
| 5,442,170 A | 8/1995 | Kreft et al. | |
| 5,477,421 A | 12/1995 | Bethurum | |
| 5,502,892 A | 4/1996 | Lien | |
| 5,565,704 A | 10/1996 | Tokuno | |
| 5,673,181 A | 9/1997 | Hsu | |
| 5,683,261 A | 11/1997 | Ahles et al. | |
| 5,912,806 A | 6/1999 | Onoda et al. | |
| 5,975,584 A | 11/1999 | Vogt | |
| 5,979,771 A | 11/1999 | Adams et al. | |
| 6,005,775 A | 12/1999 | Chiu | |
| 6,028,771 A | 2/2000 | Wong et al. | |
| 6,097,605 A * | 8/2000 | Klatt ....................... | G06F 1/183 361/737 |
| 6,097,883 A | 8/2000 | Dell et al. | |
| 6,102,743 A | 8/2000 | Haffenden et al. | |
| 6,109,939 A | 8/2000 | Kondo et al. | |
| 6,111,757 A | 8/2000 | Dell et al. | |
| 6,126,452 A | 10/2000 | Grotenhuis | |
| RE36,968 E | 11/2000 | Shieh | |
| 6,146,150 A | 11/2000 | Roberts | |
| 6,179,664 B1 | 1/2001 | Tung et al. | |
| 6,220,873 B1 * | 4/2001 | Samela ................ | H01R 12/721 439/76.1 |
| 6,233,153 B1 | 5/2001 | Baur et al. | |
| 6,257,902 B1 * | 7/2001 | Shieh ..................... | H01R 27/02 361/679.32 |
| 6,264,506 B1 * | 7/2001 | Yasufuku ............ | G06K 7/0021 439/638 |
| 6,266,724 B1 * | 7/2001 | Harari ................. | G06F 13/4068 710/13 |
| 6,304,440 B1 | 10/2001 | Lin | |
| 6,341,729 B1 | 1/2002 | Lee | |
| 6,454,585 B1 | 9/2002 | Homer et al. | |
| 6,457,647 B1 * | 10/2002 | Kurihashi ............ | G06K 7/0047 235/441 |
| 6,469,907 B1 | 10/2002 | Faveluke et al. | |
| 6,561,421 B1 * | 5/2003 | Yu ........................ | G06K 7/0008 235/451 |
| 6,641,049 B2 | 11/2003 | Luu | |
| 6,728,112 B1 | 4/2004 | Qin et al. | |
| 6,773,280 B2 * | 8/2004 | Sasaki ................ | G06K 13/0825 439/159 |
| 6,778,401 B1 * | 8/2004 | Yu ..................... | G06K 19/07732 361/736 |
| 6,785,146 B2 | 8/2004 | Koike et al. | |
| 6,808,423 B2 | 10/2004 | Lin et al. | |
| 6,808,424 B2 * | 10/2004 | Kaneshiro ............ | G06K 7/0021 439/630 |
| 6,854,984 B1 | 2/2005 | Lee et al. | |
| 6,890,188 B1 | 5/2005 | Le | |
| 6,900,988 B2 | 5/2005 | Yen | |
| 6,916,207 B2 | 7/2005 | Fielding | |
| 6,944,028 B1 | 9/2005 | Yu et al. | |
| 7,011,247 B2 | 3/2006 | Drabczuk et al. | |
| 7,020,357 B2 | 3/2006 | Hadba et al. | |
| 7,032,827 B2 | 4/2006 | Wang et al. | |
| 7,061,769 B1 | 6/2006 | Chang et al. | |
| 7,066,751 B2 | 6/2006 | Chen | |
| 7,074,052 B1 * | 7/2006 | Ni et al. ...................... | 439/76.1 |
| 7,094,086 B2 | 8/2006 | Teicher | |
| 7,104,809 B1 | 9/2006 | Huang | |
| 7,110,262 B2 * | 9/2006 | Matsumoto .......... | H05K 5/0282 361/727 |
| 7,118,421 B2 * | 10/2006 | Kadonaga ........ | G06K 19/07732 439/638 |
| 7,125,258 B2 | 10/2006 | Nakakubo et al. | |
| 7,125,287 B1 | 10/2006 | Chou et al. | |
| 7,152,801 B2 | 12/2006 | Cuellar et al. | |
| 7,162,547 B2 * | 1/2007 | Hosaka ................ | G06K 19/077 710/62 |
| 7,173,826 B1 * | 2/2007 | Chiou et al. ................... | 361/737 |
| 7,182,646 B1 | 2/2007 | Chou et al. | |
| 7,183,636 B1 * | 2/2007 | Boccia ................ | G06K 19/077 257/678 |
| 7,210,967 B1 | 5/2007 | Lee | |
| 7,218,528 B2 | 5/2007 | Chen | |
| 7,257,660 B2 | 8/2007 | Chang et al. | |
| 7,303,138 B2 | 12/2007 | Nishizawa et al. | |
| 7,357,677 B2 * | 4/2008 | Liu ....................... | G06K 13/08 439/159 |
| 7,361,059 B2 | 4/2008 | Harkabi et al. | |
| 7,364,090 B2 | 4/2008 | Cuellar et al. | |

(56) References Cited

U.S. PATENT DOCUMENTS

| | | |
|---|---|---|
| 7,364,439 B2 | 4/2008 | Lin |
| 7,383,992 B2 | 6/2008 | Le |
| 7,387,517 B2 | 6/2008 | Kusuda et al. |
| 7,410,376 B2 * | 8/2008 | Ying ................. H01R 13/2442 439/159 |
| 7,416,451 B2 | 8/2008 | Tanaka et al. |
| 7,425,157 B1 * | 9/2008 | Hung ............... G06K 19/07741 439/630 |
| 7,427,032 B2 * | 9/2008 | Osako .............. G06K 19/07739 235/380 |
| 7,458,825 B2 | 12/2008 | Atsmon et al. |
| 7,477,528 B2 | 1/2009 | Kim |
| 7,487,265 B2 | 2/2009 | Miller et al. |
| 7,491,076 B2 | 2/2009 | Gu et al. |
| 7,535,718 B2 | 5/2009 | Le |
| 7,540,786 B1 * | 6/2009 | Koser et al. ................. 439/660 |
| 7,597,260 B2 * | 10/2009 | Sato ....................... H01R 12/57 235/441 |
| 7,601,031 B2 * | 10/2009 | Tanaka ............. G06K 19/07741 439/626 |
| 7,649,742 B2 | 1/2010 | Ni et al. |
| 7,685,337 B2 | 3/2010 | Merry, Jr. et al. |
| 7,697,300 B2 | 4/2010 | Brandt et al. |
| 7,710,736 B2 | 5/2010 | Middlekauff et al. |
| 7,804,688 B2 | 9/2010 | Wakabayashi et al. |
| 7,822,883 B2 | 10/2010 | Miller et al. |
| 7,823,790 B1 | 11/2010 | Valenzuela et al. |
| 7,869,218 B2 | 1/2011 | Ni et al. |
| 7,872,873 B2 | 1/2011 | Hiew et al. |
| 7,909,251 B2 * | 3/2011 | Yi ....................... G06K 7/0034 235/451 |
| 7,940,532 B2 | 5/2011 | Willing et al. |
| 8,102,657 B2 | 1/2012 | Hiew et al. |
| 8,102,658 B2 | 1/2012 | Hiew et al. |
| 8,141,240 B2 | 3/2012 | Hiew et al. |
| 8,223,500 B2 * | 7/2012 | Yamada ............... G06K 19/077 174/521 |
| 8,291,144 B2 | 10/2012 | Pinto et al. |
| 8,982,567 B2 * | 3/2015 | Bang et al. ................... 361/737 |
| 9,202,160 B2 | 12/2015 | Han |
| 2001/0014927 A1 | 8/2001 | Chang et al. |
| 2004/0229511 A1 | 11/2004 | Chen |
| 2005/0079738 A1 | 4/2005 | Ahn |
| 2005/0182858 A1 | 8/2005 | Lo et al. |
| 2005/0230484 A1 | 10/2005 | Cuellar et al. |
| 2006/0085583 A1 | 4/2006 | Yu et al. |
| 2006/0283959 A1 | 12/2006 | Sato et al. |
| 2006/0294272 A1 | 12/2006 | Chou et al. |
| 2007/0026740 A1 * | 2/2007 | Chen ...................... H01R 31/06 439/630 |
| 2007/0150638 A1 | 6/2007 | Chen |
| 2007/0150639 A1 | 6/2007 | Chen |
| 2007/0275577 A1 | 11/2007 | Masumori |
| 2007/0290050 A1 | 12/2007 | Chen |
| 2008/0166920 A1 | 7/2008 | Johnson et al. |
| 2008/0296376 A1 * | 12/2008 | Kim ..................... G06K 7/0047 235/435 |
| 2009/0063746 A1 | 3/2009 | Drouillard et al. |

FOREIGN PATENT DOCUMENTS

| | | |
|---|---|---|
| EP | 356757 A3 | 8/1990 |
| JP | 5978652 U | 5/1984 |
| JP | 261680 U | 5/1990 |
| JP | 03048884 U | 5/1991 |
| JP | 05250865 A | 9/1993 |
| JP | 2005322109 A | 11/2005 |
| JP | 2006119983 A | 5/2006 |
| JP | 2006202525 A | 8/2006 |
| JP | 2007294617 A | 11/2007 |
| JP | 2008077923 A | 4/2008 |
| JP | 2008514017 A | 5/2008 |
| JP | 2008176809 A | 7/2008 |

OTHER PUBLICATIONS

TW 285780 published Jan. 2006.
Chinese Office Action dated Nov. 29, 2012 corresponding to Application No. 2009-10170960.
Taiwan Office Action dated Dec. 30, 2013 for in corresponding Application No. 10221805450.
Chinese Office Action dated Aug. 9, 2013 corresponding to Application No. 2009-10170960.
Japanese Office Action dated Jun. 18, 2013 corresponding to Application No. 2009-208211.
U.S. Office Communication dated Dec. 14, 2015 issued in co-pending U.S. Appl. No. 14/721,973.
U.S. Office Communication for corresponding U.S. Appl. No. 14/721,973 issued Nov. 13, 2015.
US Office Action dated Apr. 20, 2016 issued in co-pending U.S. Appl. No. 14/721,973.
Chinese First Office Action dated Mar. 3, 2016 issued in CN Application No. 2013-10722610.8 (with English translation).
US Office Action dated May 19, 2016 issued in co-pending U.S. Appl. No. 14/721,973.
U.S. Office Action dated Jul. 8, 2016 issued in co-pending U.S. Appl. No. 14/721,973.
U.S. Appl. No. 14/622,328, filed Feb. 13, 2015.
U.S. Appl. No. 14/721,973, filed May 26, 2015.
U.S. Office Action dated Sep. 6, 2016 issued in corresponding U.S. Appl. No. 14/622,328.

* cited by examiner

CIRCUIT BOARDS, CONNECTORS, CASES, CIRCUIT BOARD ASSEMBLIES, CASE ASSEMBLIES, DEVICES AND METHODS OF MANUFACTURING THE SAME

PRIORITY STATEMENT

This application is a continuation application of U.S. application Ser. No. 14/622,328, filed on Feb. 13, 2015, which is a continuation of U.S. application Ser. No. 13/678,115, filed on Nov. 15, 2012, and issued as U.S. Pat. No. 8,982,567, which is a continuation application of U.S. application Ser. No. 12/349,678, filed Jan. 7, 2009, which claims priority under 35 U.S.C. §119 to Korean Patent Application No. 10-2008-0088919 filed on Sep. 9, 2008, the entire contents of each of which are incorporated herein by reference.

BACKGROUND

Field

Example embodiments are directed to circuit boards, connectors, cases, circuit board assemblies, case assemblies, devices and methods of manufacturing the same.

Description of the Related Art

A Solid State Device (SSD) is a memory data storage device that utilizes solid state memory, for example, flash-type, non-volatile memory) to store persistent data. SSDs are an alternative conventional lard drives that have slower memory data access times due to moving parts, for example, rotating disks and/or other moving mechanical parts. The absence of moving parts in an SSD may improve electro-magnetic interference (EMI), physical shock resistance, and/or reliability.

However, SSDs may be more prone to electrostatic discharge (ESD) relative to a conventional servo motor found in a hard drive, where the recording surfaces may be made of a magnetic material that is more ESD-resistive. The ESD problem may be exacerbated by higher memory densities.

SSDs may have many different structures, sizes, dimensions, volumes, interfaces, and/or compatibilities. Each set of characteristics may be referred to as a form factor. Two examples are a 1.8 inch and 2.5 inch Serial Advanced Technology Attachment (SATA)-2 standard structures. In either structure, the SSD may include one or more of the following, a printed circuit board, one or more controller integrated circuit (ICs), for example, fine-pitch ball grid array (FPBGA) controllers, one or more NAND memory ICs, one or more mobile Synchronous Dynamic Random Access Memory (SDRAM) ICs, one or more voltage detector, one or more voltage regulator, one or more heat sink, one or more diodes, one or more connectors, including input/output (I/O) pins and clock (for, example crystal) pins, and/or a case.

As a result of a plurality of hard drive specifications, many different SSDs, having different interfaces, have been developed.

SUMMARY

Example embodiments are directed to circuit boards, connectors, cases, circuit board assemblies, case assemblies, devices and methods of manufacturing the same, which are common to at least two different form factors.

Example embodiments are directed to a circuit board including a board, common to at least a first form factor and a second form factor, first circuit board connection terminals of the first form factor, and second circuit board connection terminals of the second form factor.

Example embodiments are directed to a circuit board assembly including circuit board including a board, common to at least a first form factor and a second form factor, first circuit board connection terminals or the first form factor, and second circuit board connection terminals of the second form factor and a connector including connector connection terminals, where only one of the first circuit board connection terminals and the second circuit board connection terminals are connected to the connector connection terminals.

Example embodiments are directed to a device of a first or second form factor including.

a circuit board assembly including circuit board including a board, common to at least a first form factor and a second form factor, first circuit board connection terminals of the first form factor, and second circuit board connection terminals of the second form factor and a connector including connector connection terminals, where only one of the first circuit board connection terminals and the second circuit board connection terminals are connected to the connector connection terminals and a case of the first form factor or the second factor.

Example embodiments are directed to a circuit board including a board, first circuit board connection terminals on the board, and second circuit board connection terminals on the board, mutually exclusive of the first circuit board connection terminals.

Example embodiments are directed to a case assembly including at least a top surface or a bottom surface, of a first form factor or a second form factor, a connector, attached to the top surface or the bottom surface, the connector including first circuit board connection terminals of the first form factor and second circuit board connection terminals of the second form factor, and a securing element attached to the top surface or the bottom surface, the connector including connector connection terminals, where only one of the first circuit board connection terminals and the second circuit board connection terminals are connected to the connector connection terminals.

Example embodiments are directed to a device of a first form factor including a case assembly including at least a top surface or a bottom surface, of a first form factor or a second form factor, a connector, attached to the top surface or the bottom surface, the connector including first circuit board connection terminals of the first form factor and second circuit board connection terminals of the second form factor, and a securing element attached to the top surface or the bottom surface, the connector including connector connection terminals, where only one of the first circuit board connection terminals and the second circuit board connection terminals are connected to the connector connection terminals and a board, common to at least the first form factor and the second form factor, including first circuit board connection terminals of the first form factor and second circuit board connection terminals of the second form factor, wherein the first circuit board connection terminals of the first form factor of the board are connected to the first circuit board connection terminals of the first form factor of the connector and the board is secured to the case by the securing element.

Example embodiments are directed to a device of a second form factor including a case assembly including at least a top surface or a bottom surface, of a first form factor or a second form factor, a connector, attached to the top surface or the bottom surface, the connector including first circuit board connection terminals of the first form factor and second circuit board connection terminals of the second form factor, and a securing element attached to the top surface or the bottom surface, the connector including connector connection terminals, where only one of the first circuit board connection terminals and the second circuit board connection terminals are connected to the connector connection terminals and a board, common o at least the first form factor and the second form factor, including first circuit board connection terminals of the first form factor and second circuit board connection terminals of the second form factor, wherein the first circuit board connection terminals of the first form factor of the board are connected to the first circuit board connection terminals of the first form factor of the connector and the board is secured to the case by the securing element.

Example embodiments are directed to a case assembly including at least one of three sides, a top, and a bottom surface and a connector, connected to the at least one of three sides, the top, and the bottom surface, the connector including connector connection terminals.

Example embodiments are directed to a device including a case of one of a first form factor and a second form factor, a circuit board of the first form factor, first circuit board connection terminals of the first form factor, and second circuit board connection terminals of the second form factor.

Example embodiments are directed to a connector including first connector connection terminals of a first form factor and second connector connection terminals of a second form factor.

Example embodiments are directed to a method of manufacturing a common circuit board including providing a board, common to at least a first form factor and a second form factor, forming first circuit board connection terminals of the first form factor on the board, and forming second circuit board connection terminals of the second form factor on the board.

Example embodiments are directed to a method of connecting a common circuit board including providing a board, common to at least a first form factor and a second form factor with first circuit board connection terminals of the first form factor and second circuit board connection terminals of the second form factor on the board, and connecting the common circuit board to an external device using only one of the first connection and second circuit board connection terminals.

Example embodiments are directed to method of manufacturing an assembly or device by combining at least two of a circuit board, a connector, and a case to form any one of a circuit board assembly, a case assembly, or a device.

BRIEF DESCRIPTION OF THE DRAWINGS

The above and other features and advantages of example embodiments will become more apparent by describing them in detailed with reference to the accompanying drawings.

DETAILED DESCRIPTION

Figure 1:
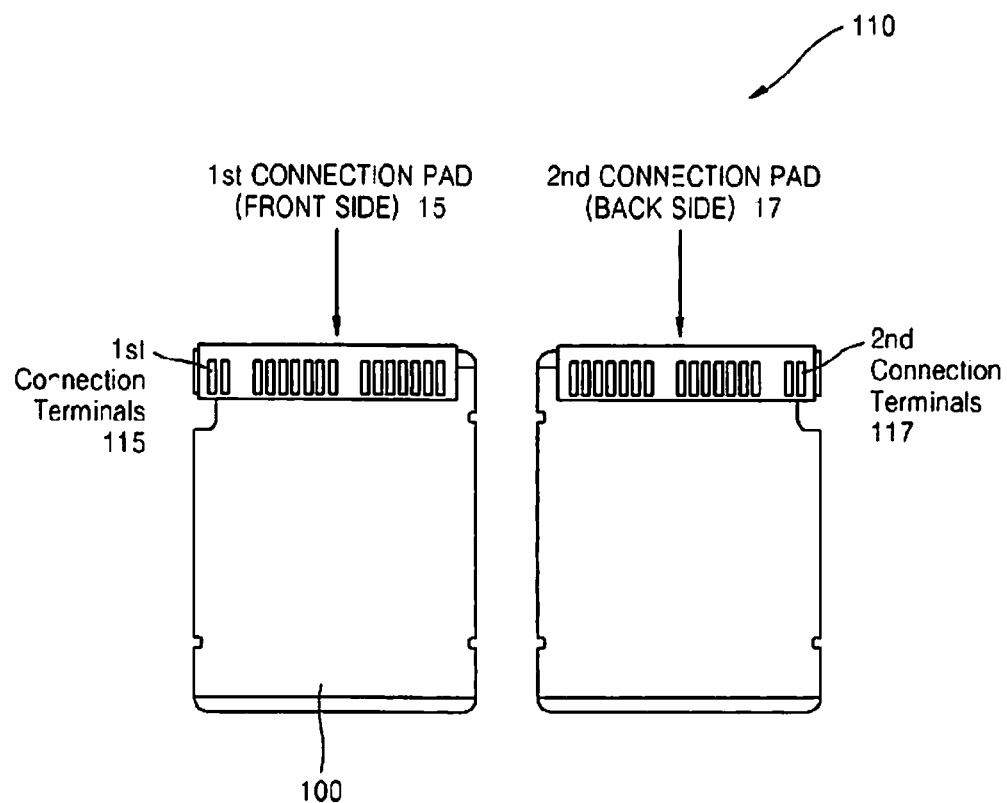
FIGS. 1-2 illustrate circuit boards in accordance with example embodiments.

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc, may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component Or feature's relationship to another component(s) or feature(s) as illustrated in the drawings. it will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence or stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout. Example embodiments should not be construed as limited to the particular shapes of regions illustrated in these figures but are to include deviations in shapes that result, for example, from manufacturing.

FIG. 1 illustrates a circuit board 110 in accordance with example embodiments. The circuit board 110 may include a common board 100. N connection pads 15, 17 (where N is an integer ≥2) and N connection terminals 115, 117. In example embodiments, illustrates in FIG. 1, the circuit board 110 includes two circuit board connection pads 15 and 17, each including circuit board connection terminals 115, 117, respectively. In example embodiments, the first circuit board connection terminals 115 may be of a first form factor and the second circuit board connection terminals 117 may be of a second form factor.

As shown, the circuit board 110 may be a common circuit board, namely a circuit board that may be used with other components of the first form factor or other components of the second form factor. In example embodiments, the other components may be circuit Nord assemblies, connectors, cases, or case assemblies.

As shown, the circuit board 110 may also be a common circuit board, namely a circuit board that may be a component of a device of the first Rum factor or a device of the second form factor. In example embodiments, the device may be a memory device, for example, a memory card.

In example embodiments, the circuit board connection terminals 115, 117 may be on different sides of the circuit board 110. For example, as shown in FIG. 1, the first circuit board connection terminals 115 are on a front side of the circuit board 110 and the second circuit board connection terminals 117 are on a back side of the circuit board 110. In other example embodiments, the circuit board connection terminals 115, 117 may be on the same side of the circuit board 110.

In example embodiments, the circuit board connection terminals 115, 117 may be on the same end of the circuit board 110. For example, as shown in FIG. 1, the first circuit board connection terminals 115 and the second circuit board connection terminals 117 are on the same end of the circuit board 110. In other example embodiments, the circuit board connection terminals 115, 117 may be different or opposite ends of the circuit board 110.

Figure 2:
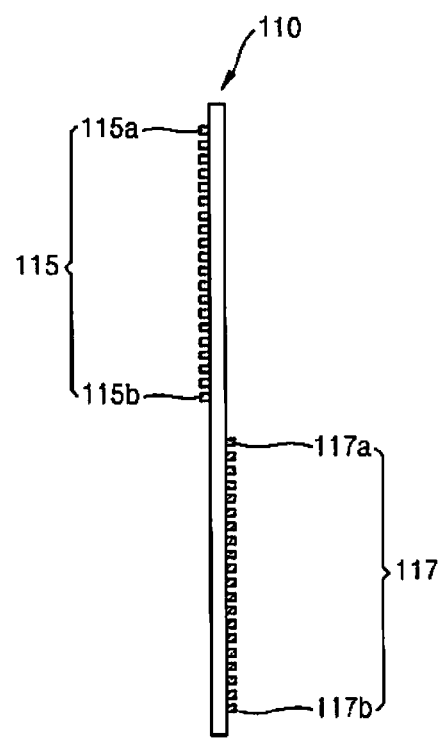

In example embodiments as shown in FIG. 2, the circuit board connection terminals 115, 117 may be on different sides and different ends of the circuit board 110.

In example embodiments, the location of the first circuit board connection terminals 115 and the second circuit board connection terminals 117 may be reversed. in example embodiments, the first circuit board connection terminals 115 and the second circuit board connection terminals 117 may be on the same side of circuit board 110 or on different (for example, opposite) sides of the circuit board 110.

Figure 3:
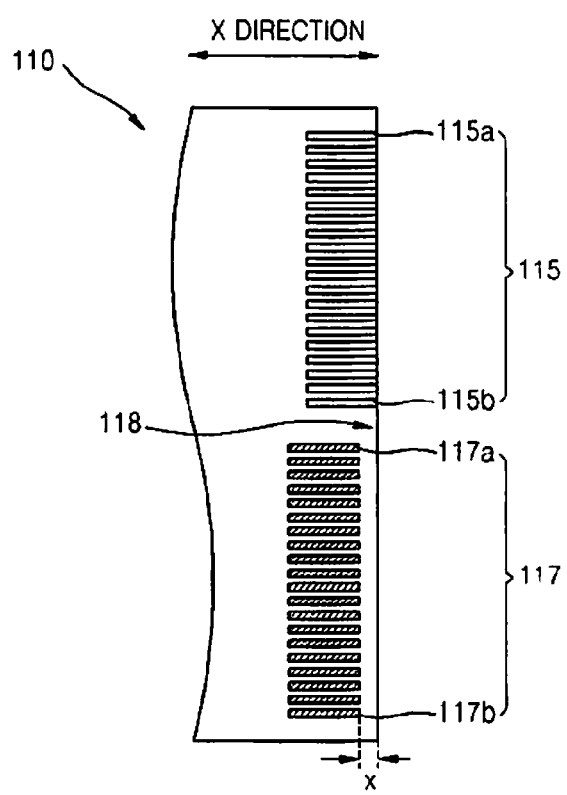
FIGS. 3-7 illustrate portions of circuit boards in accordance with example embodiments.

FIG. 3 illustrates a portion of a circuit board 110 in accordance with example embodiments. In example embodiments, the first circuit board connection terminals 115 may be located on an edge 118 of the circuit board 110 and the second circuit board connection terminals 117 may be offset a distance x in an x-direction from the edge of circuit board 110. In example embodiments, x is less than a length of the first circuit board connection terminals 115 in the x-direction.

In example embodiments shown in FIG. 3, a first terminal area 121 and a second terminal area 123 overlap in the x-direction.

In other example embodiments, the first circuit board connection terminals 115 may be offset a first distance $x_1$ in the x-direction from the edge of circuit board 110 and the second circuit board connection terminals 117 may be offset a second distance $x_2$ in the x-direction from the edge of circuit board 110. In other example embodiments, the first circuit board connection terminals 115 and the second circuit board connection terminals 117 may be located on the edge 118 of the circuit board 110. In example embodiments, $x_1$ and/or $x_2$ may be less than a length of the first circuit board connection terminals 115 and/or the second circuit board connection terminals 117 in the x-direction.

FIGS. 4-7 illustrate portions of circuit boards in accordance with example embodiments. In example embodiments, the first circuit board connection terminals 115, including first end circuit board connection terminals 115a, 115b may be located in the first terminal area 121 and the second circuit board connection terminals 117, including second end circuit board connection terminals 117a, 117b may be located in the second terminal area 123.

Figure 4:
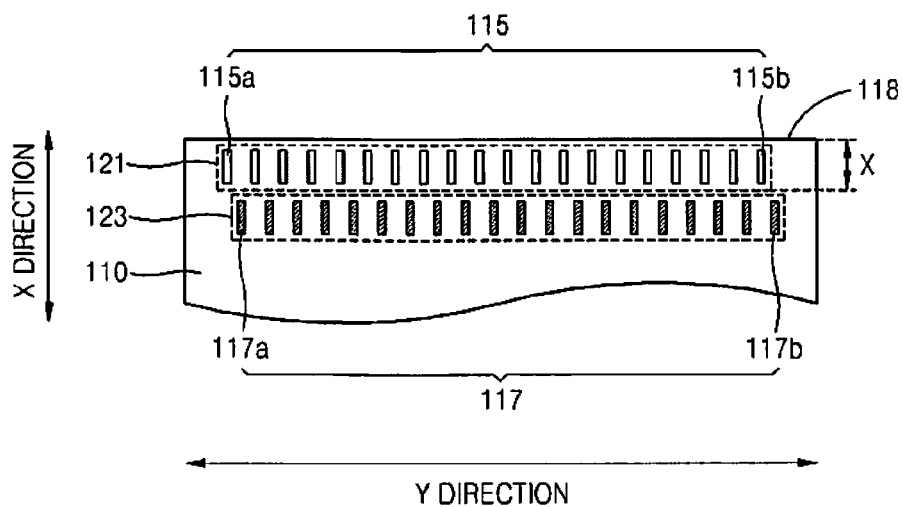

In example embodiments shown in FIG. 4, the fast circuit board connection terminals 115 may be located on the edge 118 of the circuit board 110 and the second circuit board connection terminals 117 may be offset a distance x in an x-direction from the edge of circuit board 110. In example embodiments, x is greater than or equal to a length of the first circuit board connection terminals 115 in the x-direction.

In example embodiments shown in FIG. 4, the first terminal area 121 and the second terminal area 123 do not overlap in the x-direction.

In example embodiments, the first circuit board connection terminals 115 may be offset a first distance $x_1$ in an x-direction from the edge of circuit board 110 and the second circuit board connection terminals 117 may be offset a second distance x, in an x-direction from the edge of circuit board 110. In example embodiments, $x_1$ and/or $x_2$ may be greater than or equal to a length of the first circuit board connection terminals 115 and/or the second circuit board connection terminals 117 in the x-direction.

In example embodiments shown in FIG. 4, the first circuit board connection terminals 115 and the second circuit board connection terminals 117 may also be offset in the y-direction. For example, the first circuit board connection terminals 115 and the second circuit board connection terminals 117 are staggered as shown in FIG. 4, with the first terminal area 121 beginning before the second terminal area 123 and ending before the second terminal area 123 in the y-direction.

In example embodiments shown in FIG. 4, individual first circuit board connection terminals 115 and individual second circuit board connection terminals 117 do not overlap in the y-direction.

Figure 5:
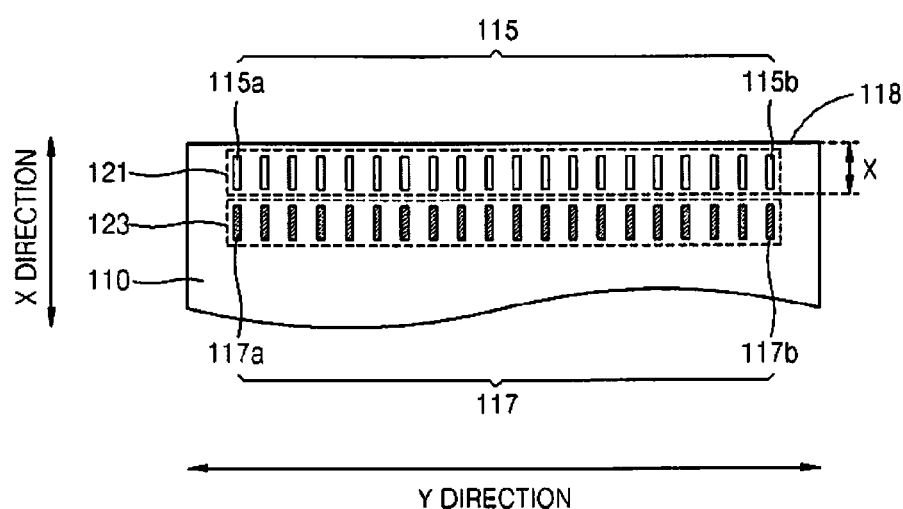

In example embodiments shown in FIG. 5, the first circuit board connection terminals 115 may be located on an edge 118 of the circuit board 110 and second circuit board connection terminals 117 may be offset a distance x in an x-direction from the edge of circuit board 110. In example embodiments, the first circuit board connection terminals 115 may be offset a first distance $x_1$ in an x-direction from the edge of circuit board 110 and second circuit board connection terminals 117 may be offset a second distance $x_2$ in an x-direction from the edge of circuit board 110.

In example embodiments shown in FIG. 5, the first terminal area 121 and the second terminal area 123 do not overlap in the x-direction.

In example embodiments shown in FIG. 5, the first circuit board connection terminals 115 and the second circuit board connection terminals 117 are not offset in the y-direction. For example, the first circuit board connection terminals 115 and the second circuit board connection terminals 117 are not staggered as shown in FIG. 4, with the first terminal area 121 beginning and ending at the same location as the second terminal area 123 in the y-direction.

Figure 6:
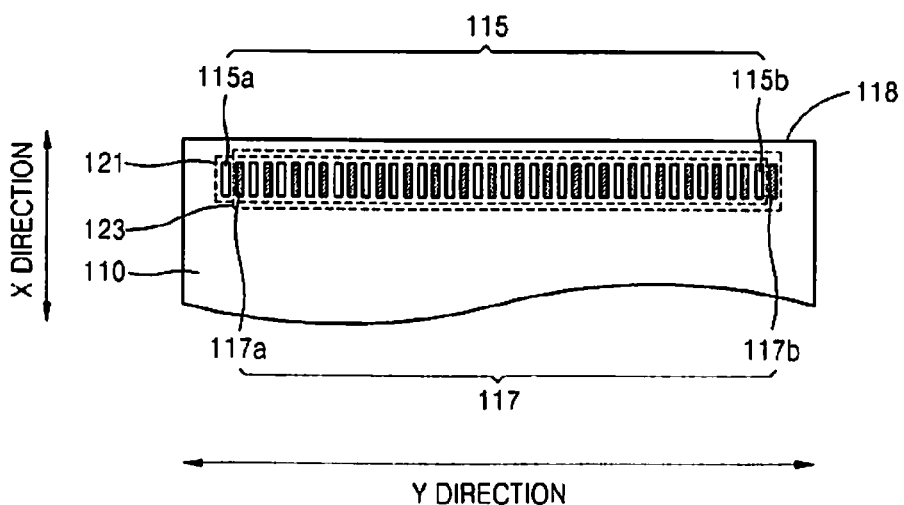

In example embodiments shown in FIG. 6, the first circuit board connection terminals 115 may be located on an edge 118 of the circuit board 110 and the second circuit board connection terminals 117 may also be located on the edge of circuit board 110. In example embodiments, the first circuit board connection terminals 115 may be offset a first distance $x_1$ in an x-direction from the edge of circuit board 110 and second circuit board connection terminals 117 may also be offset the first distance $x_1$ in an x-direction from the edge of circuit board 110.

In example embodiments shown in FIG. 6, the first terminal area 121 and the second terminal area 123 substantially overlap in the x-direction.

In example embodiments shown in FIG. 6, individual first circuit board connection terminals 115 and individual second circuit board connection terminals 117 are offset in the y-direction. For example, the first circuit board connection terminals 115 and the second circuit board connection terminals 117 are staggered as shown in FIG. 6, with the first terminal area 121 beginning before the second terminal area 123 and ending before the second terminal area 123 in the y-direction.

Figure 7:
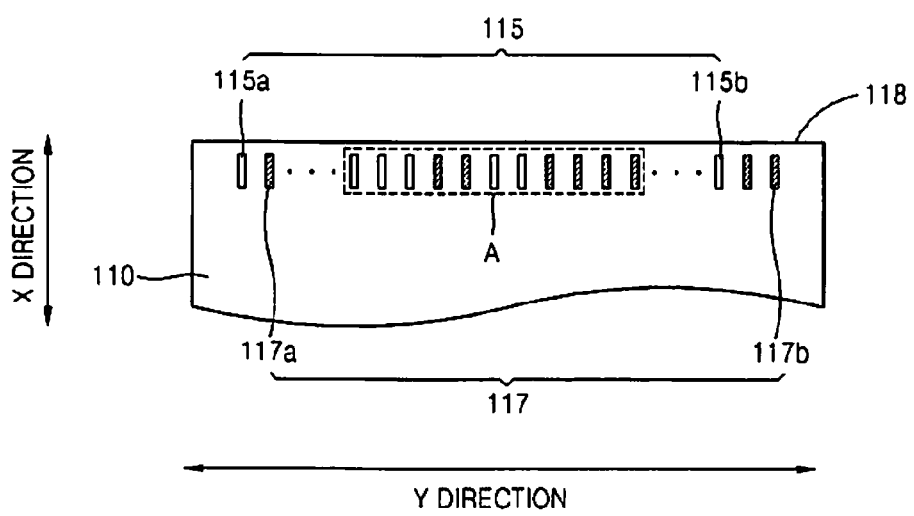

In example embodiments shown in FIG. 7, the first circuit board connection terminals 115 and the second circuit board connection terminals 117 may be arranged substantially the same as shown in FIG. 6. However, instead of the first circuit board connection terminals 115 and the second circuit board connection terminals 117 alternating, as shown in FIG. 6, the first circuit board connection terminals 115 and the second circuit board connection terminals 117 may be grouped in any fashion. For example, as specifically shown in area A, first circuit board connection terminals 115 and/or second circuit board connection terminals 117 may be grouped together or alternately.

As discussed above, circuit boards in accordance with example embodiments may include any or all of the above features. As a result, circuit boards in accordance with example embodiments may be useable as common circuit boards with various other components of the same or different form factors. Circuit boards in accordance with example embodiments may be useable as a component of a device of the same or different form factors. In example embodiments, the device may be a memory device, for example, a memory card.

Figure 8A:
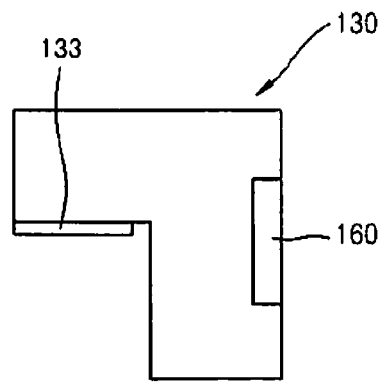
FIGS. 8A and 8B illustrate connectors usable with example embodiments.
Figure 8B:
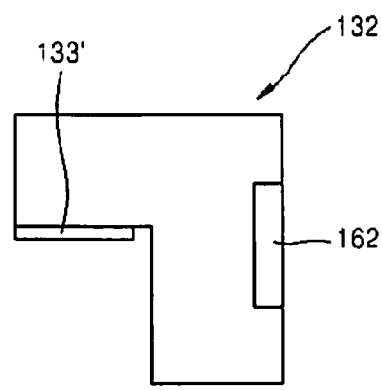

FIGS. 8A and 8B illustrate connectors usable with example embodiments. FIG. 8A illustrates a connector 130 of a first form factor. The connector 130 of the first form factor may be connectable to any example embodiment of the common circuit board 110 discussed above. The connector 130 may include connector connection terminals 133. The connector connection terminals 133 may be connectable to the first circuit board connection terminals 115 of the first form factor of the circuit board 110. In such a configuration, the second circuit board connection terminals 117 of the circuit board 110 may be unconnected. The connector 130 may also include an interface 160 for connection to other devices of the first form factor.

FIG. 8B illustrates a connector 132 of a second form factor. The connector 132 of the second form factor may be connectable to any example embodiment of the common circuit board 110 discussed above, The connector 132 may include connector connection terminals 133'. The connector connection terminals 133' may be connectable to the second circuit board connection terminals 117 of the second form factor of the circuit board 110. In such a configuration, the first circuit board connection terminals 115 of the circuit board 110 may be unconnected, The connector 130 may also include an interface 162 for connection to other devices of the second form factor.

Figure 8C:
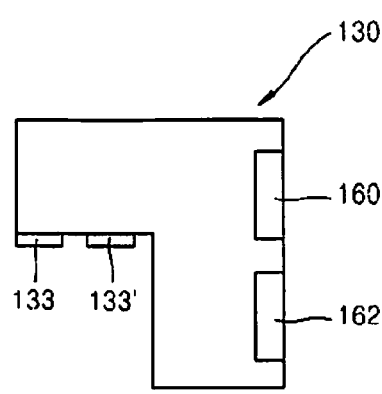
FIG. 8C illustrates a connector in accordance with example embodiments.

In other example embodiments as shown in FIG. 8C, the connector 130/132 may be common to the first form factor and the second form factor, in which case, the connector connection terminals 133 are connectable to the first circuit board connection terminals 115 or the connector connection terminals 133' are connectable to the second circuit board connection terminals 117.

Figure 9A:
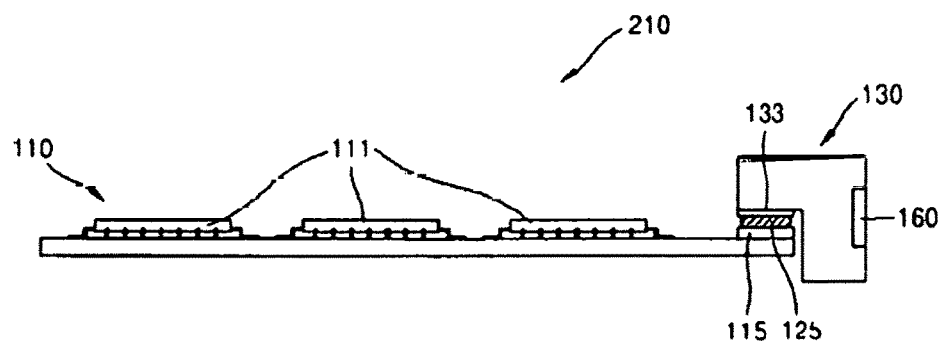
FIGS. 9A and 9B illustrate circuit board assemblies including a circuit board in accordance with example embodiments.
Figure 9B:
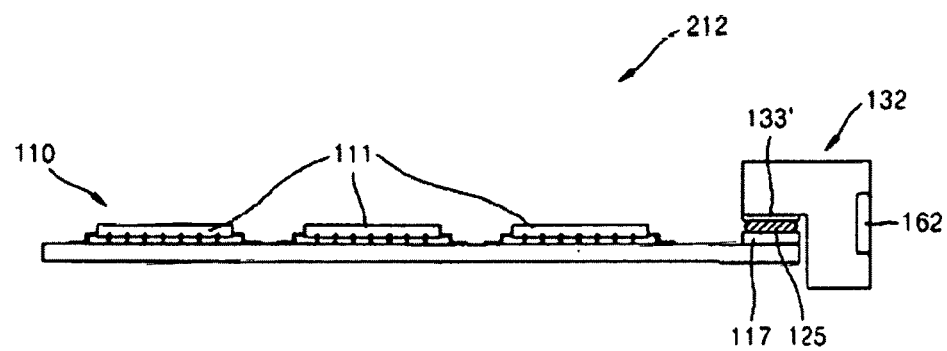

FIGS. 9A and 9B illustrate circuit board assemblies including a circuit board in accordance with example embodiments.

FIG. 9A illustrates a circuit board assembly 210 including a circuit board 110 in accordance with example embodiments. As shown in FIG. 9A, one or more memory modules 111, for example, NAND flash packages, may be connected to the circuit board 110. The first circuit board connection terminals 115 of the circuit board 110 may be connected to connector connection terminals 133 of a connector 130 via a conductor 125, for example, one or more solder balls or solder paste. In example embodiments shown in FIG. 9A, the connector 130 may be of the first form factor, in which case, the connector connection terminals 133 are connectable to the first circuit board connection terminals 115. In such an assembly, the second circuit board connection terminals 117 may be unconnected.

FIG. 9B illustrates a circuit board assembly 212 including a circuit board 110 in accordance with example embodiments. As shown in FIG. 9B, one or more memory modules 111, for example, NAND flash packages, may be connected to the circuit board 110. The second circuit board connection terminals 117 of the circuit board 110 may be connected to connector connection terminals 133' of a connector 132 via a conductor 125, for example, one or more solder balls or solder paste. In example embodiments, the connector 132 may be of the second form factor, in which case, the connector connection terminals 133' of the connector are connectable to the second circuit board connection terminals 117. In such an assembly, the first circuit board connection terminals 115 may be unconnected.

Figure 10A:
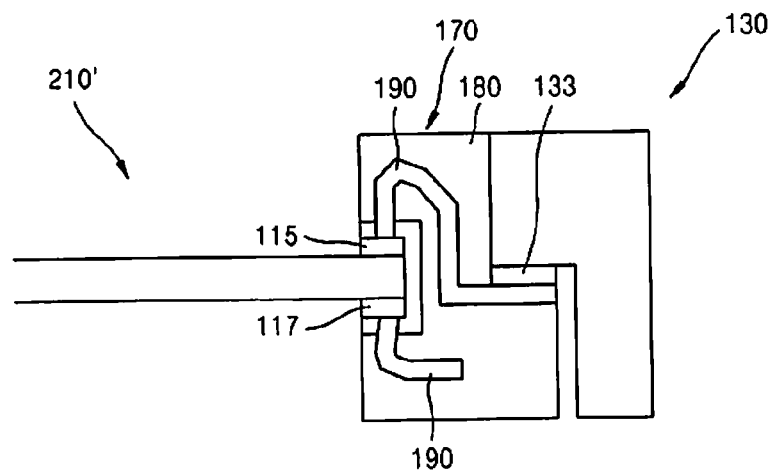
FIGS. 10A and 10B illustrate circuit board assemblies including a circuit board in accordance with example embodiments.
Figure 10B:
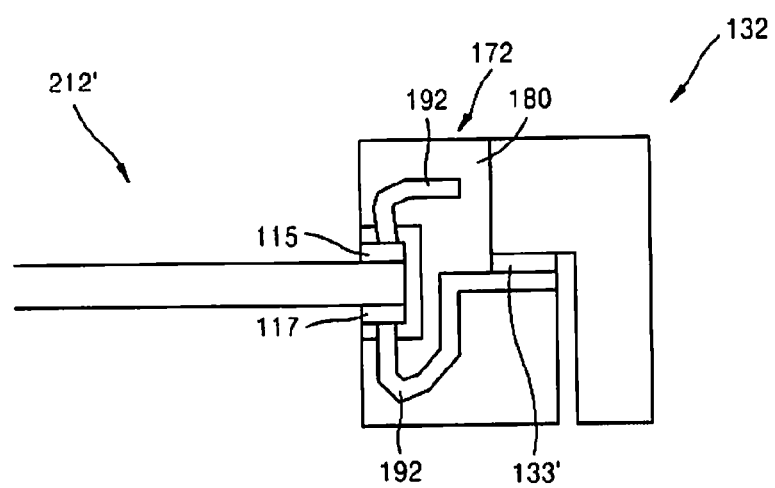

FIGS. 10A and 10B illustrate circuit board assemblies including a circuit board in accordance with example embodiments.

FIG. 10A illustrates a circuit board assembly 210' including a circuit board 110 in accordance with example embodiments. The circuit board assembly 210' of FIG. 10A is similar to that of the circuit board assembly 210 of FIG. 9A, except that instead of solder balls or solder paste, a mechanical adapter connector 170 including a non-conductive part 180 and a conductive part 190, is used to connect the connector connection terminals 133 to the first circuit board connection terminals 115. Similar to the circuit board assembly 210 of FIG. 9A, the second circuit board connection terminals 117 may be unconnected.

FIG. 10B illustrates a circuit board assembly 220' including a circuit board 110 in accordance with example embodiments. The circuit board assembly 220' of FIG. 10B is similar to that of the circuit board assembly 220 of FIG. 9B, except that instead of solder balls or solder paste, a mechanical adapter connector 172 including a non-conductive part 182 and a conductive part 192, is used to connect the connector connection terminals 133' to the second circuit board connection terminals 117, Similar to the circuit board assembly 220 of FIG. 9B, the first circuit board connection terminals 115 may be unconnected.

Any or all of the circuit board features discussed above with respect to FIGS. 1-7 may be applied to the circuit board assemblies 210, 220, 210', or 220'.

Figure 11A:
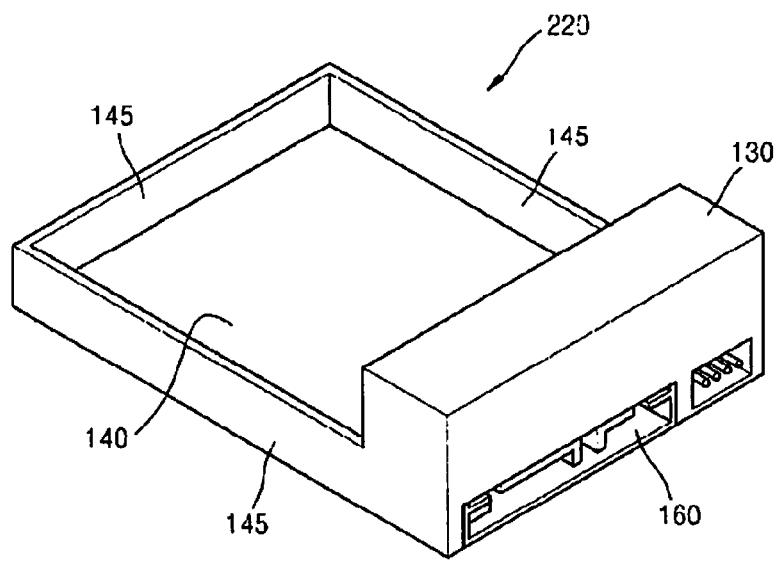
FIGS. 11A and 11B illustrate case assemblies including a connector in accordance with example embodiments.
Figure 11B:
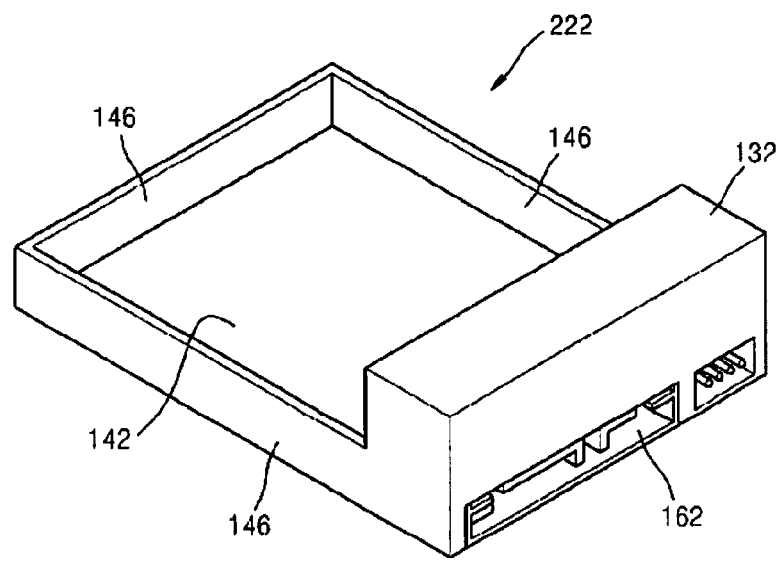

FIGS. 11A and 11B illustrate case assemblies including a connector in accordance with example embodiments.

FIG. 11A illustrates a case assembly 220 including a connector 130 and a case 140 in accordance with example embodiments. The connector 130 may be any example embodiment of a connector discussed above. The case 140 may include at least one of three sides, a top, and/or a bottom surface element. As shown in FIG. 11A, the case 140 includes three side surface elements 145, but no top surface element and no bottom surface element. In example embodiments, the connector 130 and the case 140, and hence, the case assembly 220 itself, are both of the same (for example, the first) form factor.

FIG. 11B illustrates a case assembly 222 including a connector 132 and a case 142 in accordance with example embodiments. The connector 132 may be any example embodiment of the connector 132 discussed above. The case 140 may include at least one of three sides, a top, and/or a bottom surface element. As shown in FIG. 11B, the case 142 includes three side surface elements 146, but no top surface element and no bottom surface element. In example embodiments, the connector 132 and the case 142, and hence, the case assembly 222 itself, are both of the same (for example, the second) form factor.

In other example embodiments, for example. similar to those shown in FIG. 8C, the connector 130/132 of the case assembly 220/222 may be common to the first form. factor and the second form factor, in which case, the connector 130/132 may include connector connection terminals 133 connectable to first circuit board connection terminals 115 and connector connection terminals 133' connectable to second circuit board connection terminals 117. Similarly, the connector 130/132 may include the interface 160 for connection to other devices of the first form factor and/or the interface 162 for connection to other devices of the second form factor.

In other example embodiments, for example, similar to those shown in FIG. 8C, the case 140/142 may be common to the first form factor and the second form factor in which case, the case 140/142 may accommodate a connector 130 and/or a connector 132.

Figure 12A:
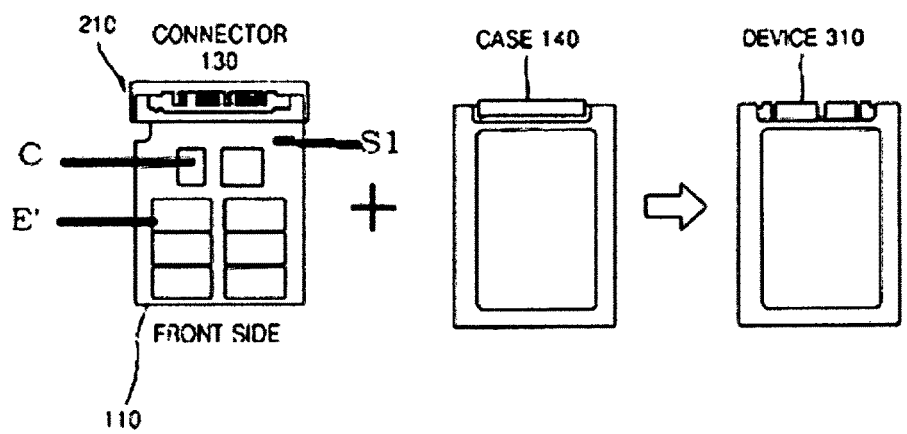
FIGS. 12A and 12B illustrate devices, for example, memory devices including circuit board assemblies including circuit boards and connectors and cases in accordance with example embodiments.
Figure 12B:
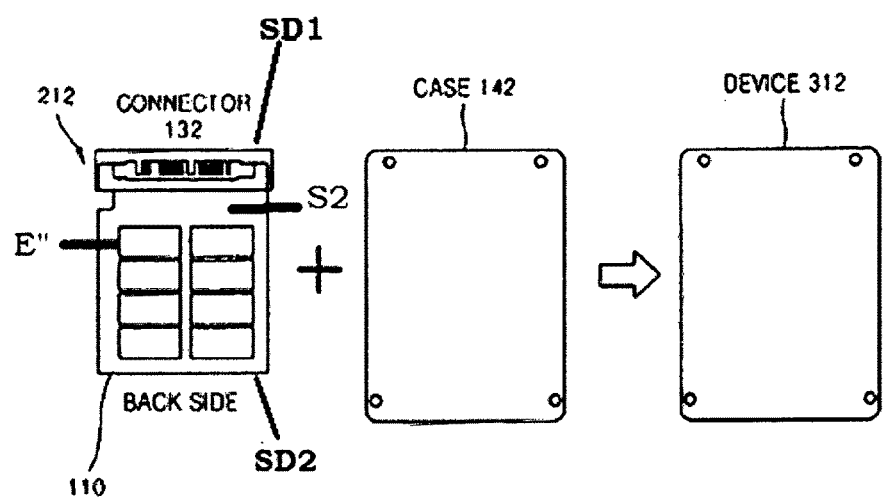

FIGS. 12A and 12B illustrate devices, for example, memory devices including circuit board assemblies including circuit boards and connectors and cases in accordance with example embodiments.

FIG. 12A illustrates a device, for example, a memory device 310 including circuit board assembly 210 including circuit board 110 and case 140 in accordance with example embodiments. As shown in FIG. 12A, a memory device 310 of a first form factor may be formed by combining a circuit board assembly 210 including a circuit board 110 including first circuit board connection terminals 115 of the first form factor and second Circuit board connection terminals 117 of the second form factor and a connector 130 including connector connection terminals 133, connectable to the first circuit board connection terminals 115 of the first form factor with a case 140 of the first form factor. The circuit board assembly 210 may include a memory controller C and first flash memory package E' on a first surface Si of the circuit board 110. In such a device, the second circuit board connection terminals 117 may be unconnected. As shown in FIG. 12A, the case 140 includes four side surface elements 145 and a top surface element and/or a bottom surface element.

FIG. 12B illustrates a device, for example, a memory device 312 including circuit board assembly 212 including circuit board 110 and case 142 in accordance with example embodiments. As shown in FIG. 12B, the memory device 312 of the second form factor may be formed by combining a circuit board assembly 212 including a circuit board 110 including first circuit board connection terminals 115 of the first form factor and second circuit board connection terminals 117 of the second form factor and a connector 132 including connector connection terminals 133', connectable to the second circuit hoard connection terminals 117 of the second form factor with a case 142 of the second form factor. The circuit board assembly 210 may include a second flash memory package E" on a second surface S2 of the circuit board 110. The circuit board 110 may include a first side SD1 opposite a second side SD2. In such a device, the first circuit board connection terminals 115 may be unconnected. As shown in FIG. 12B, the case 142 includes four side surface elements 146 and a top surface element and/or a bottom surface element.

Any or all of the circuit board features discussed above with respect to FIGS. 1-7 may be applied to the circuit board assemblies 210, 212. Any or all of the circuit board assembly features discussed above with respect to FIGS. 9A-10B may be applied to the devices 310, 312.

In other example embodiments, for example, similar to those shown in FIG. 8C, the connector 130/132 may be common to the first form factor and the second form factor, in which case, the connector 130/132 may include connector connection terminals 133 connectable to first circuit board connection terminals 115 and connector connection terminals 133' connectable to second circuit board connection terminals 117. Similarly, the connector 130/132 may include the interface 160 for connection to other devices of the first form factor and/or the interface 162 for connection to other devices of the second form factor.

In other example embodiments, for example, similar to those shown in FIG. 8C, the case 140/142 may be common to the first form factor and the second form factor in winch case, the case 140/142 may accommodate a circuit board assembly 210 and/or a circuit board assembly 212.

Figure 13A:
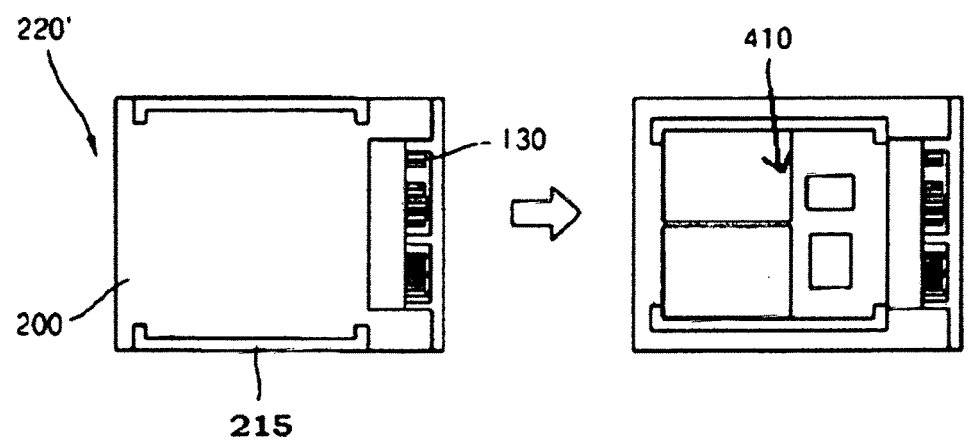
FIGS. 13A and 13B illustrate devices, for example, memory devices including circuit boards and case assemblies including connectors and cases in accordance with example embodiments.
Figure 13B:
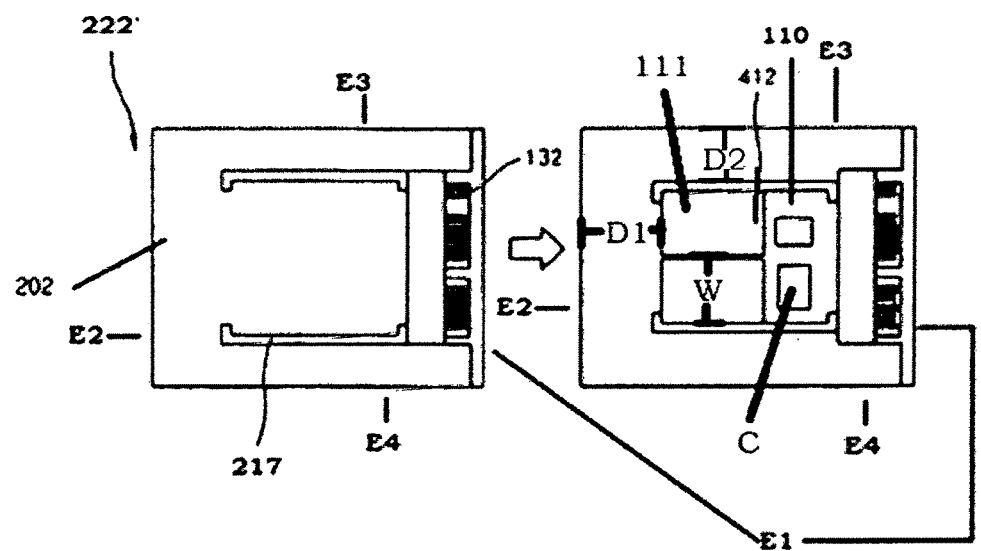

FIGS. 13A and 13B illustrate devices, for example, memory devices including circuit boards and case assemblies including connectors and cases in accordance with example embodiments.

FIG. 13A illustrates a device, for example, a memory device 410 including a case assembly 220' and circuit board 110 in accordance with example embodiments. As shown in FIG. 13A, a memory device 410 of a first form factor may be thrilled by combining a case assembly 220' of the first form factor with the circuit board 110. The case assembly 220' of the first form factor may include a surface element 200 of the first form factor and a connector 130 of the first form factor. The circuit board 110 may include the first circuit board connection terminals 115 of the first form factor and the second circuit board connection terminals 117 of the second form factor. The connector 130 of the first form factor may include connector connection terminals 133. The connector connection terminals 133 may be connectable to the first circuit board connection terminals 115 of the first form factor. In such a device, the second circuit board connection terminals 117 may be unconnected.

In example embodiments, the case assembly 220 may further include one or more securing elements 215, configured to secure the circuit board 110 to the surface element 200. In example embodiments, the one or more securing elements 215 may be guide rails, by which the circuit board 110 may be secured, In example embodiments, the surface element 200 may be a top element or a bottom element.

FIG. 13B illustrates a device, for example, a memory device 412 including a case assembly 222' and circuit board 110 in accordance with example embodiments. As shown in FIG. 13B, a memory device 412 of a first form factor may be formed by combining a case assembly 222' of the second form factor with the circuit board 110. The circuit board 110 may include memory modules 111 (e.g., NAND flash packages) and a controller C on the circuit board 110. The surface element 202 may include a first edge E1, second edge E2, third edge E3, and a fourth edge E4. The second edge E2 may be located opposite the first edge E1. The case assembly 222 of the second form factor may include a surface element 202 of the second form factor and a connector 132 of the second form factor. The circuit board 110 may include the first circuit board connection terminals 115 of the first form factor and the second circuit board connection terminals 117 of the second form factor. The connector 132 of the second form factor may include connector connection terminals 133', The connector connection terminals 133' may be connectable to the second circuit board connection terminals 117 of the second form factor. In such a device, the first circuit board connection terminals 115 may be unconnected. A first distance DI may be greater than a width W of one of the memory modules 111. The first distance DI may be shortest distance between the circuit board 110 and the second edge E2 of the surface element 202.

In example embodiments, the case assembly 222' may further include one or more securing elements 217, configured to secure the circuit board 110 to the surface element 202. In example embodiments, the one or more securing elements 217 may be guide rails, by which the circuit board 110 may be secured.

In example embodiments, the surface element 202 may be a top element or a bottom element.

Any or all of the case assembly features discussed above with respect to FIGS. 11A-11B may be applied to the memory device 410, 412.

In other example embodiments, for example, similar to those shown in FIG. 8C, the connector 130/132 may he common to the first form factor and the second form factor, in which case, the connector 130/132 may include connector connection terminals 133 connectable to first circuit board connection terminals 115 and connector connection terminals 133' connectable to second circuit board connection terminals 117. Similarly, the connector 130/132 may include the interface 160 for connection to other devices of the first form factor and/or the interface 162 for connection to other devices of the second form factor.

Example embodiments of circuit boards, connectors, cases, circuit board assemblies, case assemblies, and/or devices, as discussed above may be implemented as components or sub-components in one or more sub-system or system as described in more detail below.

Figure 14:
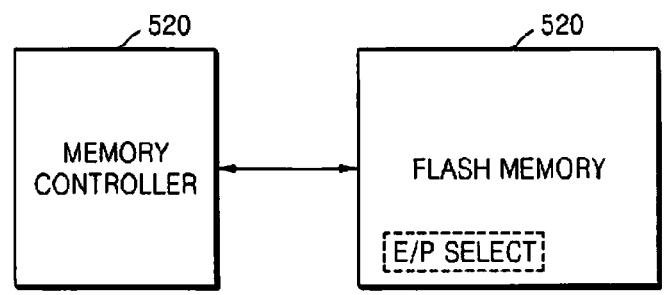
FIG. 14 illustrates an example embodiment including a memory controller in accordance with example embodiments.

FIG. 14 illustrates an example embodiment including a memory controller in accordance with example embodiments. As shown, FIG. 14 includes a memory 510 connected to a memory controller 520. The memory 510 may be a NAND flash memory or NOR flash memory. However, the memory 510 is not limited to these memory types, and may be any memory type.

The memory controller 520 may supply the input signals for controlling operation of the memory 510. For example, in the case of a NAND flash memory, the memory controller 520 may supply the command CMD and address signals. In examples of a NOR flash memory, the memory controller 520 may supply CMD, ADD, DQ and VPP signals. It will be appreciated that the memory controller 520 may control the memory 510 based on received control signals (not shown).

Figure 15:
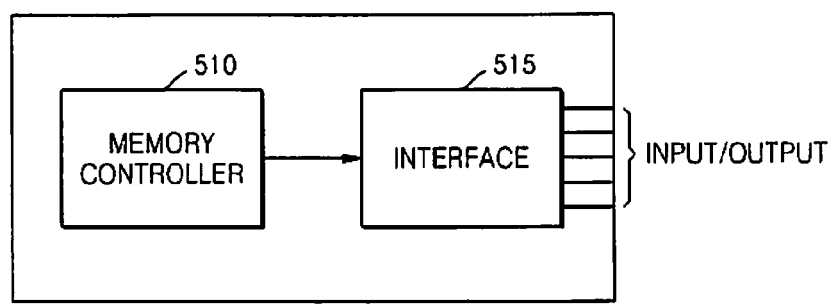
FIG. 15 illustrates another example embodiment including an interface in accordance with example embodiments.

FIG. 15 illustrates another example embodiment including an interface in accordance with example embodiments. As shown, FIG. 15 includes a memory 510 connected to an interface 515. The memory 510 may be a NAND flash memory or a NOR flash memory. However, the memory 510 is not limited to these memory types, and may be any memory type.

The interface 515 may supply the input signals (for example, generated externally) for controlling operation of the memory 510. For example, in the case of a NAND flash memory, the interface 515 may supply the command CMD and address signals. In the example of a NOR flash memory, the interface 515 may supply CMD, ADD, DQ and VPP signals. it will be appreciated that the interface 515 may control the memory 510 based on received control signals (for example, generated externally, but not shown).

Figure 16:
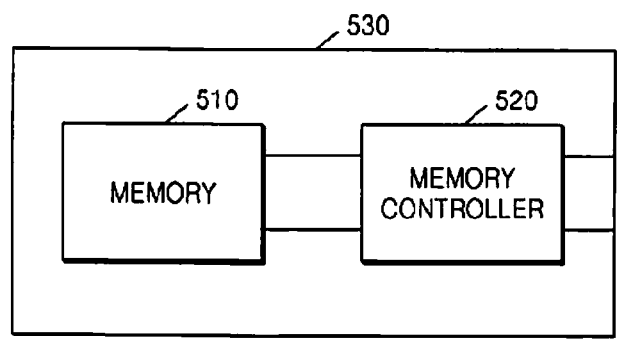
FIG. 16 illustrates an example memory card in accordance with example embodiments.

FIG. 16 illustrates an example memory card in accordance with example embodiments. FIG. 16 is similar to FIG. 14, except that the memory 510 and memory controller 520 have been embodied as a card 530. For example, the card 530 may be a memory card such as a flash memory card. Namely, the card 530 may be a card meeting any industry standard for use with a consumer electronics device such as a digital camera, personal computer, etc. It will be appreciated that the memory controller 520 may control the memory 510 based on controls signals received by the card 530 from another (e.g., external) device.

Figure 17:
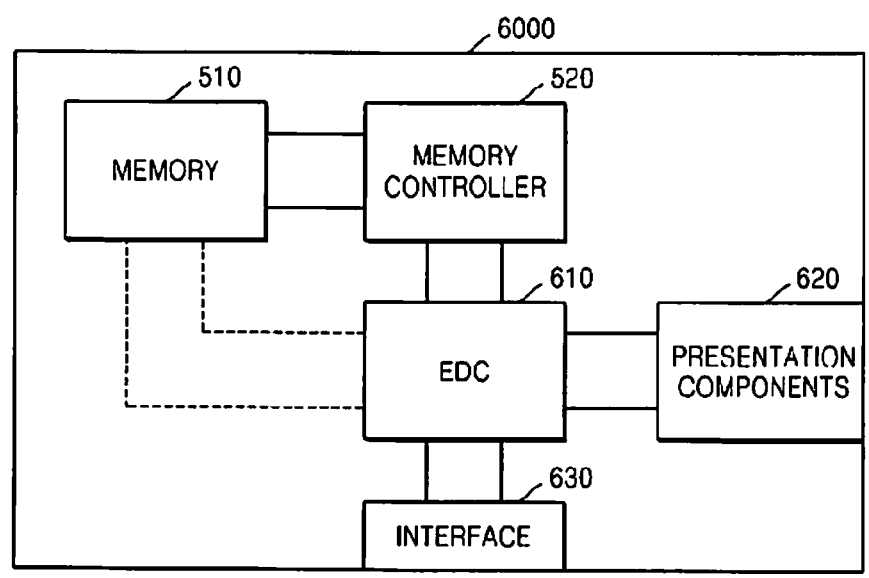
FIG. 17 illustrates an example portable device in accordance with example embodiments.

FIG. 17 illustrates an example portable device M accordance with example embodiments. FIG. 17 represents a portable device 6000. The portable device WOO may be an MP3 player, video player, combination video and audio player, etc. As shown, the portable device 6000 includes the memory 510 and memory controller 520. The portable device 6000 may also includes an encoder and decoder 610, presentation components 620 and interface 630.

Data (video, audio, etc.) may be input to and output from the memory 510 via the memory controller 520 by an encoder and decoder (EDC) 610. As shown by the dashed lines in FIG. 28, the data may be directly input to the memory 510 from the EDC 610 and/or directly output from the memory 510 to the EDC 610.

The EDC 610 may encode data for storage in the memory 510. For example, the EDC 610 may perform MP3 encoding on audio data for storage in the memory 510. Alternatively, the EDC 610 may perform MPEG encoding (e.g., MPEG2, MPEG4, etc.) on video data for storage in the memory 510. Still further, the EDC 610 may include multiple encoders for encoding different types of data according to different data formats. For example, the EDC 610 may include an MP3 encoder for audio data and an MPEG encoder for video data.

The EDC 610 may decode output from the memory 510. For example, the EDC 610 may perform MP3 decoding on audio data output from the memory 510. Alternatively, the EDC 610 may perform MPEG decoding (e.g., MPEG2, MPEG4, etc.) on video data output from the memory 510. Still further, the EDC 610 may include multiple decoders for decoding different types of data according to different data formats. For example, the EDC 610 may include an MP3 decoder for audio data and an MPEG decoder for video data.

It will also be appreciated that EDC 610 may include only decoders. For example, already encoded data may be received by the EDC 610 and passed to the memory controller 520 and/or the memory 510.

The EDC 610 may receive data for encoding, or receive already encoded data, via the interface 630. The interface 630 may conform to a known standard (e.g., firewire, USB, etc.). The interface 630 may also include more than one interface. For example, interface 630 may include a firewire interface, a USB interface, etc. Data from the memory 510 may also be output via the interface 630.

The presentation components 620 may present data output from the memory, and/or decoded by the EDC 610, to a user. For example, the presentation components 620 may include a speaker jack for outputting audio data, a display screen for outputting video data and/or etc.

Figure 18:
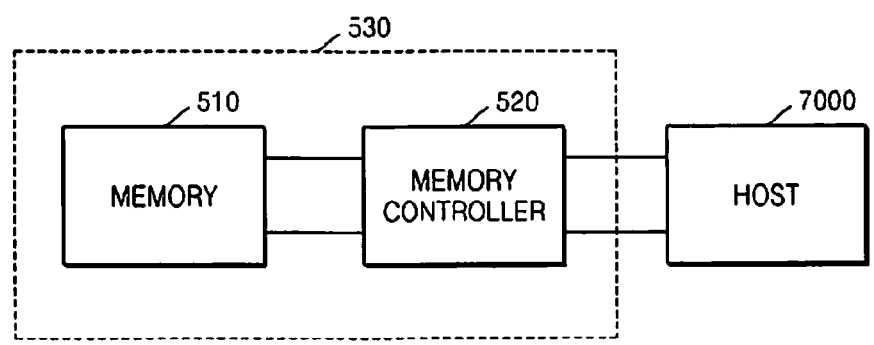
FIG. 18 illustrates an example memory card and host system in accordance with example embodiments.

FIG. 18 illustrates an example memory card and host system in accordance with example embodiments M which the host system 7000 is connected to the card 530 of FIG. 16. In example embodiments, the host system 7000 may apply control signals to the card 530 such that the memory controller 520 controls operation of the memory 510.

Figure 19:
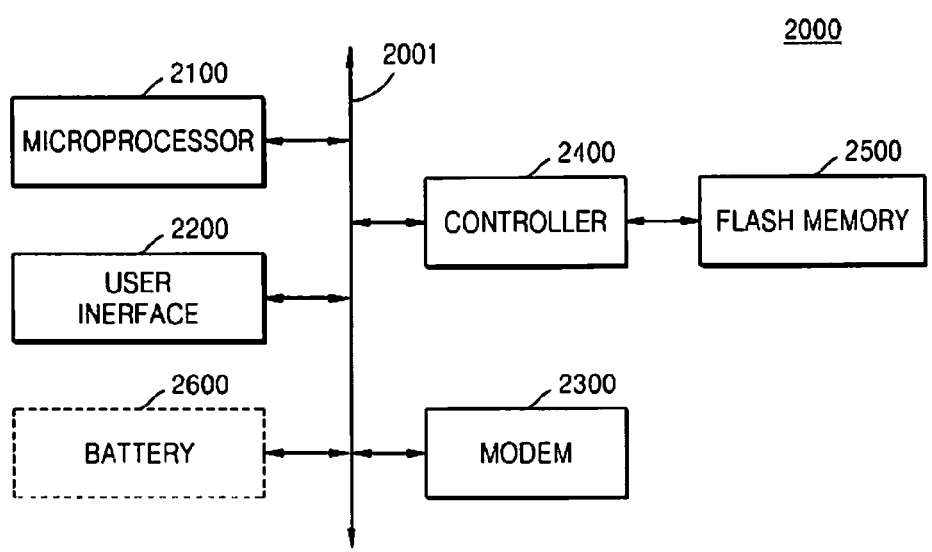
FIG. 19 illustrates an example system in accordance with example embodiments.

FIG. 19 illustrates an example system in accordance with example embodiments. As shown, system 2000 may include a microprocessor 2100, user interface 2200, for example, a keypad, a keyboard, and/or a display, modem 2300, controller 2400, memory 2500 and/or battery 2600. In example embodiments, each of the system elements may be combined each other through a bus 2001.

The controller 2400 may also include one or more microprocessors, a digital signal processor, a microcontroller, or any processor similar to the above. The memory 2500 may be used to store data and/or commands executed by the controller 2400. The memory 2500 may be any of any of the memories described in example embodiments above.

The modem 2300 may be used to transmit data to and/or from another system, for example, a communication network. The system 2000 may be part of a mobile system, such as a PDA, a portable computer, web tablet, a wireless phone, a mobile phone, a digital music player, memory card, or other system transmitting and/or receiving information.

Figure 20:
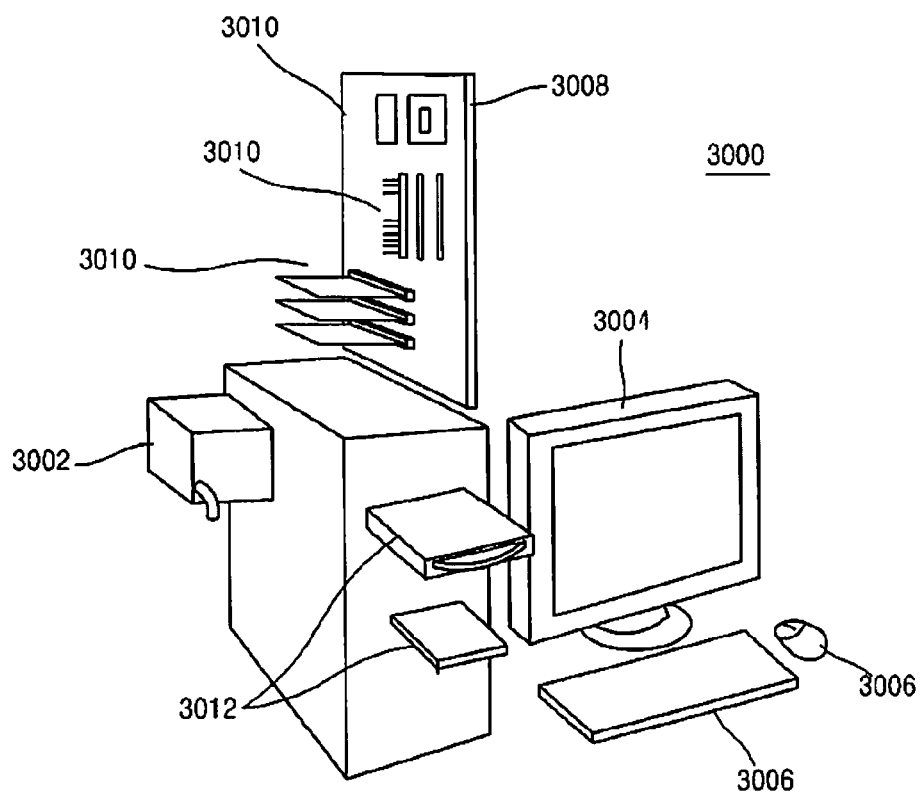
FIG. 20 illustrates an example computer system in accordance with example embodiments.

FIG. 20 illustrates an example computer system in accordance with example embodiments. As shown, the computer system 3000 may include one or more power supplies 3002, one or more monitors 3004 (for example, a conventional and/or touch-screen monitor), one or more input devices 3006, for example, a mouse, a keyboard, and/or a stylus, a main or motherboard 3008, to which one or more components 3010 are attached. The one or more sub-components 3010 may be one or more central processing units (CPUs), one or more memories, and/or one or more cards. The computer system 3000 may include one or more additional memories 3012, which may be removable or more easily removable.

In example embodiments, the computer system 3000 may be desktop, personal computer, a laptop personal computer, and/or a handheld personal computer. in example embodiments, the computer system 3000 may be a server.

Example embodiments of circuit boards, connectors, cases, circuit board assemblies, case assemblies, and/or devices, as discussed above may be implemented as components or sub-components in one or more computer system 3000, as described above.

Figure 21:
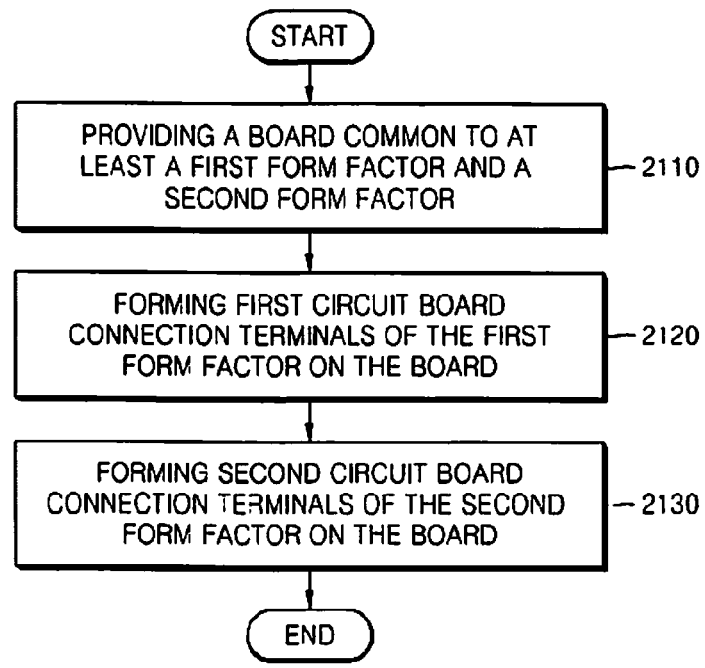
FIG. 21 illustrates a method of manufacturing a common circuit board in accordance with example embodiments.

FIG. 21 illustrates a method. of manufacturing a common circuit board in accordance with example embodiments. As shown in FIG. 21 at 2110, a board 100 is provided that is common to at least a first form factor and a second form factor. At 2120, first circuit board connection terminals 115 of the first form factor are formed on the board 100. At 2130, second circuit board connection terminals 117 of the second form factor are formed on the board 100.

Figure 22:
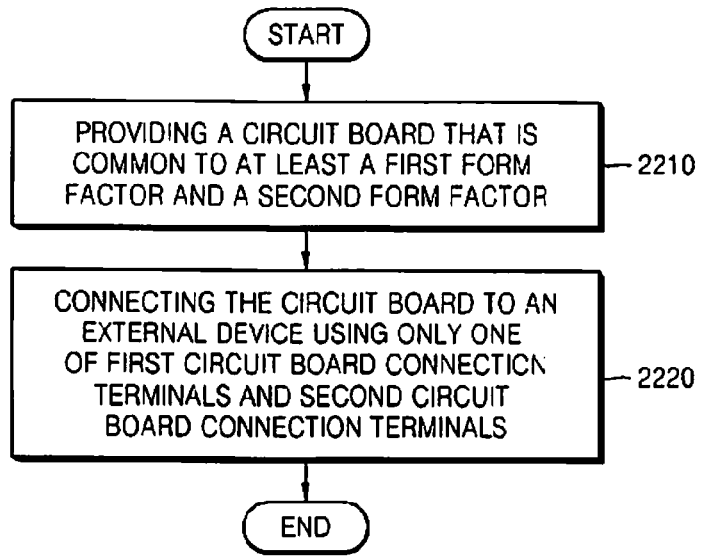
FIG. 22 illustrates a method of connecting a common circuit board in accordance with example embodiments.

FIG. 22 illustrates a method of connecting a common circuit board in accordance with example embodiments. As shown in FIG. 22 at 2210, a circuit board 110 is provided that is common to at least a first form factor and a second form factor. The circuit board 110 includes first circuit board connection terminals 115 of the first form factor and second circuit board connection terminals 117 of the second form factor. At 2220, the circuit board 110 is connected to an external device using only one of the first circuit board connection terminals 115 and second circuit board connection terminals 117.

Figure 23:
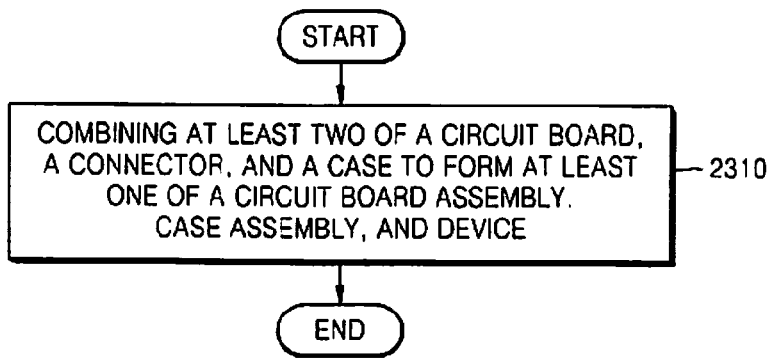
FIG. 23 illustrates a method of manufacturing an assembly or device in accordance with example embodiments.

FIG. 23 illustrates a method of manufacturing an assembly or device in accordance with example embodiments. As shown in FIG. 23 at 2310, at least two of a circuit board, for example, any of circuit boards 110 discussed above, a connector, for example, any of connectors 130/132 discussed above, and a case, for example, any of the cases 140/142 discussed above, may be combined to Com any one of the circuit board assemblies 210, 212, 210', 212' discussed above, any one of the case assemblies 220, 222 discussed above, or any one of the devices 310, 312, 410, 412 discussed above.

As set forth above, any of circuit boards 110 discussed above may be combined with any of connectors 130/132 discussed above to form any of the circuit board assemblies 210, 212, 210', 212' discussed above. Any of connectors 130/132 discussed above may be combined with any of the cases 140/142 discussed above to form any of the case assemblies 220, 222 discussed above. Any of circuit boards 110 discussed above may be combined with any of the connectors 130/132 discussed above and any of the cases 140/142 discussed above to form any of the devices 310, 312, 410, 412 discussed above.

In example embodiments, the circuit boards, connectors, cases, circuit board assemblies, case assemblies, devices disclosed herein may be SSDs, for example, electronics with no moving parts, hence, less fragile than hard disks, having no mechanical delays, and/or lower access times and/or latency than electromechanical devices.

In example embodiments, the circuit boards, connectors, cases, circuit board assemblies, case assemblies, devices disclosed herein may be components of flash memories, for example, NAND or NOR flash memories. In example embodiments, the circuit boards, connectors, cases, circuit board assemblies, case assemblies, devices disclosed herein may be components of Multi-level cell (MLC) flash memory or Single-level cell (SLC) flash memory.

In example embodiments, the circuit boards, connectors, cases, circuit board assemblies, case assemblies, devices disclosed herein may be components of DRAM memories.

While example embodiments discussed above refer to a first and second form factor, each embodiments may implement M form factors, where M≥2.

In example embodiments, the first and second form factors are the 1.8 inch and 2.5 inch SATA-2 standard structures. In example embodiments, the first and second form factors may be the 15-inch SATA-2 standard structure or another structure, for example, a CompactFlash Type (for example, Type I or II). SD memory card, miniSD, microSD, TransFlash, MultiMediaCard (MMC), MMCplus, RS-MMC, DV RS-MMC, MMCmobile, MMCmicro, Memory Stick, Memory Stick PRO, Memory Stick Duo, Memory Stick PRO Duo, SmartMedia Card, xD-Picture Card, PC Card (for example, Types I, II, or III), and/or USB Flash Drive Example embodiments being thus described, it will be obvious that the same may be varied in many ways. Such variations are not to be regarded as a departure from example embodiments, and all such modifications are intended to be included within the scope of append claims.

What is claimed:

1. A solid state drive (SSD) comprising:
    a case including a bottom surface having a first edge, a second edge, a third edge, and a fourth edge, the second edge of the bottom surface of the case being located opposite to the first edge of the bottom surface of the case, the case including side walls;
    a plurality of circuit board connection terminals along the first edge of the case;
    at least one securing element disposed on the bottom surface of the case of the SSD separately from the side walls of the case;
    a circuit board secured to the bottom surface of the case by the at least one securing element, the circuit board including a first surface having a first side opposite a second side of the circuit board;
    a plurality of connection terminals disposed along the first side of the first surface of the circuit board, the first side of the first surface of the circuit board being disposed closer to the first edge of the bottom surface of the case than the second edge of the bottom surface of the case, the second side of the first surface of the circuit board being closer to the second edge of the bottom surface of the case than the first edge of the bottom surface of the case, the plurality of connection terminals being connected to the plurality of circuit board connection terminals at the first surface of the circuit board via a conductor; and
    a first package disposed on the first surface of the circuit board, and having a width and a length that is equal to or greater than the width, the length being substantially perpendicular to the width, each of the length and the width being measured on a top surface of the first package, the top surface of the first package being substantially parallel with the first surface of the circuit board,
    wherein at least one of a memory and a memory controller is included inside the first package,
    a first distance is greater than the width of the first package, the first distance being a shortest distance between the second side of the first surface of the circuit board and the second edge of the bottom surface of the case,
    a second distance is greater than the width of the first package, the second distance being a shortest distance between the circuit board and the third edge of the bottom surface of the case,
    the first distance is greater than the second distance,
    the at least one securing element extends by edges of the circuit board between the first side and the second side and is entirely spaced from the second edge of the case,
    the at least one securing element is substantially spaced apart from each of the first edge, the second edge, the third edge, and the fourth edge of the bottom surface of the case,
    the at least one securing element forms a frame for engaging at least two sides of the circuit board to receive the circuit board by non-sliding motion into the case, and
    the circuit board is secured to the bottom surface of the case.

2. The SSD of claim 1, wherein an area of the bottom surface of the case is at least one and a half times greater than an area of the first surface of the circuit board.

3. The SSD of claim 1, wherein
    the case has a size for the second form factor,
    the circuit board has a size for the first form factor that is different from the second form factor, and
    the second form factor is larger than the first form factor.

4. The SSD of claim 1, wherein the SSD includes only one circuit board.

5. The SSD of claim 1, wherein the securing element includes one or more guide rails.

6. The SSD of claim 5, wherein at least one of the one or more guide rails is spaced apart from the first, second, third and fourth edges of the bottom surface of the case.

7. The SSD of claim 1, wherein the memory included inside the first package is a NAND flash memory.

8. The SSD of claim 1, wherein the memory included inside the first package is a NOR flash memory.

9. The SSD of claim 1, further comprising:
    a second package,
    wherein at least one of the memory and the memory controller is included inside the second package.

10. The SSD of claim 1, wherein
    the at least one securing element includes at least one rail structure contacting three (3) side surfaces of the circuit board.

11. The SSD of claim 1, wherein
the at least one securing element includes at least one rail structure contacting three (3) side surfaces of the circuit board.

12. The SSD of claim 1, wherein
the at least two sides of the circuit board that are engaged by the frame of the at least one securing element are at least two outmost straight sides of the circuit board, and
the frame formed by the at least one securing element includes a contiguous structure that engages the at least two sides of the circuit board.

13. A solid state drive (SSD) comprising:
a case including a bottom surface having a first edge, a second edge, a third edge and a fourth edge, the case including side walls;
one or more guide rails disposed on the bottom surface of the case of the SSD separately from the side walls of the case;
a circuit board secured to the bottom surface of the case by the one or more guide rails, the circuit board including a first surface, the first surface of the circuit board having a first side;
a plurality of circuit board connection terminals along the first edge of the case.
one or more packages disposed on the first surface of the circuit board; and
a plurality of connection terminals disposed along the first side of the first surface of the circuit board, the first side of the first surface of the circuit board being disposed closer to the first edge of the bottom surface of the case than to an opposite edge of the first edge of the bottom surface of the case, the plurality of connection terminals being used either for a first form factor or for a second form factor, the plurality of connection terminals being connected to the plurality of circuit board connection terminals at the first surface of the circuit board via a conductor,
wherein at least one of a memory and a memory controller is included inside one of the one or more packages,
the case has a size for the second form factor,
the circuit board has a size for the first form factor that is different from the first form factor,
an area of the bottom surface of the case is at least one and a half times greater than an area of the first surface of the circuit board,
the SSD includes only one circuit board,
at least one of the one or more guide rails extends by the edges of the circuit board between the first side and the second side and is substantially spaced apart from each of the first, second, third and fourth edges of the bottom surface of the case,
the one or more packages include a first package having a width and a length that is equal to or greater than the width, the length being substantially perpendicular to the width, each of the length and the width being on a top surface of the first package, the top surface of the first package being substantially parallel with the first surface of the circuit board,
a first distance is greater than the width of the first package, the first distance being a shortest distance between the circuit board and the second edge of the bottom surface of the case,
the one or more guide rails form a frame for engaging at least two sides of the circuit board to receive the circuit board by non-sliding motion into the case, and
the circuit board is secured to the bottom surface of the case.

14. The SSD of claim 13, wherein the second edge of the bottom surface of the case is located opposite to the first edge of the bottom surface of the case.

15. The SSD of claim 13, wherein the third edge of the bottom surface of the case is located opposite to the first edge of the bottom surface of the case.

16. The SSD of claim 13, wherein the memory included inside at least one of the one or more packages is a NAND flash memory.

17. The SSD of claim 13, wherein the memory included inside at least one of the one or more packages is a NOR flash memory.

18. The SSD of claim 13, wherein
the at least two sides of the circuit board that are engaged by the frame of the one or more guide rails are at least two outmost straight sides of the circuit board, and
the frame formed by the one or more guide rails includes a contiguous structure that engages the at least two sides of the circuit board.

19. A solid state drive (SSD) comprising:
a case including a bottom surface having a first edge, a second edge, a third edge and a fourth edge, the case including side walls;
at least one securing element disposed on the bottom surface of the case of the SSD separately from the side walls of the case;
a circuit board secured to the bottom surface of the case by the securing element, the circuit board including a first surface having a first side and a second side opposite the first side;
a plurality of connection terminals disposed along the first side of the first surface of the circuit board, the first side of the first surface of the circuit board being disposed closer to the first edge of the bottom surface of the case than a first distance between the second side of the circuit board and the second edge of the bottom surface of the case, the second edge of the bottom surface of the case being opposite the first edge of the bottom surface of the case, the first distance being a shortest distance between the circuit board and the second edge of the bottom surface of the case;
a flash memory package disposed on the first surface of the circuit board, and having a first width and a first length that is equal to or greater than the first width, the first length being substantially perpendicular to the first width, each of the first length and the first width being measured on a top surface of the flash memory package, the top surface of the flash memory package being substantially parallel with the first surface of the circuit board; and
a memory controller package disposed on the first surface of the circuit board,
wherein the first distance is greater than the width of the first package and the at least one securing element extends by edges of the circuit board between the first side and the second side and is entirely spaced from the second edge of the case,
the at least one securing element is substantially spaced apart from each of the first edge, the second edge, the third edge, and the fourth edge of the bottom surface of the case, and
the at least one securing element forms a frame for engaging at least two sides of the circuit board to receive the circuit board by non-sliding motion into the case.

20. The SSD of claim 19, wherein the second edge of the bottom surface of the case is located opposite to the first edge of the bottom surface of the case.

21. The SSD of claim 19, wherein an area of the bottom surface of the case is at least one and a half times greater than an area of the first surface of the circuit board.

22. The SSD of claim 19, wherein
the case has a size for the second form factor, and
the circuit board has a size for the first form factor that is different from the second form factor, and
the second form factor is larger than the first form factor.

23. The SSD of claim 19, wherein the flash memory package includes either a NAND flash memory or a NOR flash memory.

24. The SSD of claim 19, wherein
the at least one securing element includes at least one rail structure contacting three (3) side surfaces of the circuit board.

25. The SSD of claim 19, wherein
the at least two sides of the circuit board that are engaged by the frame of the at least one securing element are at least two outmost straight sides of the circuit board, and
the frame formed by the at least one securing element includes a contiguous structure that engages the at least two sides of the circuit board.

* * * * *